United States Patent
Baylis et al.

(10) Patent No.: US 7,262,115 B2
(45) Date of Patent: Aug. 28, 2007

(54) METHOD AND APPARATUS FOR BREAKING SEMICONDUCTOR WAFERS

(75) Inventors: William H. Baylis, Tiburon, CA (US); John E. Tyler, Napa, CA (US)

(73) Assignee: Dynatex International, Santa Rosa, CA (US)

( * ) Notice: Subject to any disclaimer, the term of this patent is extended or adjusted under 35 U.S.C. 154(b) by 197 days.

(21) Appl. No.: 11/213,015

(22) Filed: Aug. 26, 2005

(65) Prior Publication Data

US 2007/0048972 A1    Mar. 1, 2007

(51) Int. Cl.
    *H01L 21/301* (2006.01)
(52) U.S. Cl. ............. 438/460; 438/462; 225/96.5
(58) Field of Classification Search ........ 438/460–465, 438/113, 114; 225/96.5, 103, 23
    See application file for complete search history.

(56) References Cited

U.S. PATENT DOCUMENTS

| | | | |
|---|---|---|---|
| 3,790,051 A | 2/1974 | Moore | |
| 4,088,255 A | 5/1978 | DeTorre | |
| 4,109,841 A | 8/1978 | DeTorre | |
| 4,225,070 A | 9/1980 | Dahlberg et al. | |
| 4,653,680 A | 3/1987 | Regan | |
| 5,069,195 A | 12/1991 | Barozzi | |
| 5,154,333 A | 10/1992 | Bauer et al. | |
| 5,303,861 A | 4/1994 | Allaire et al. | |
| 5,458,269 A | 10/1995 | Loomis | |
| 5,820,006 A | 10/1998 | Turner | |
| 6,171,933 B1 | 1/2001 | Xu et al. | |
| 6,475,878 B1 * | 11/2002 | Slepcevic | 438/460 |
| 6,513,694 B1 | 2/2003 | Xu et al. | |
| 6,782,883 B2 | 8/2004 | Chen et al. | |
| 6,818,532 B2 * | 11/2004 | Yeom et al. | 438/460 |

FOREIGN PATENT DOCUMENTS

| | | |
|---|---|---|
| EP | 0334751 | 9/1989 |
| JP | 1133704 | 5/1989 |
| JP | 8124878 | 5/1996 |
| WO | WO9946816 | 9/1999 |

* cited by examiner

*Primary Examiner*—Tuan H. Nguyen
(74) *Attorney, Agent, or Firm*—Barry N. Young (57) ABSTRACT

An apparatus and method for breaking a semiconductor wafer along scribe lines to separate individual die. A scribe line of the wafer is aligned with a straight, elongated pyramid-shaped edge of a precision bending bar, and a compressive force is applied to the surface of the wafer by a compressive member to bend the wafer over the edge and break the wafer along the scribe line.

26 Claims, 8 Drawing Sheets

METHOD AND APPARATUS FOR BREAKING SEMICONDUCTOR WAFERS

BACKGROUND OF THE INVENTION

This invention relates generally to methods and apparatus for breaking frangible substrates, and more particularly to the breaking of brittle semiconductor wafers and the like to separate the wafer into individual dies.

In the manufacture of microelectronic devices, such as integrated circuits and the like, a plurality of such devices are fabricated as individual dies on a single semiconductor wafer. The wafer is then separated into individual dies utilizing semiconductor scribing and breaking equipment. Wafer scribing may be performed with saws, sharp diamond-pointed scribing tools or lasers to form stress lines on the wafer along which the wafer will be broken to separate the individual dies. Wafers are broken along the scribe lines by applying tensile strain across the scribe line sufficient to cause the wafer to break. This may be accomplished in different ways. In one known form of wafer breaking apparatus shown in U.S. Pat. No. 5,820,006 to Turner, assigned to the assignee of the present invention, a scribe line is aligned with a straight sharp blade of an impulse bar, and the sharp edge is forced to impact the bottom surface of the wafer directly beneath the scribe line, bending the wafer upwardly and placing the upper surface of the wafer under tension along the scribe line opposite the sharp edge. Another known form of breaking apparatus is disclosed in U.S. Pat. No. 5,458,269 to Loomis in which the wafer is supported on the plane surface of a mandrel having a sharp edge. A scribe line on the wafer on is aligned along the edge. A break wheel having either wheel profiles which engage the upper surface of the wafer on opposite sides of the scribe line or a compliant surface that rolls over the wafer along the scribe line causes the wafer to bend over the edge and break along the scribe line. The tensile strain applied to the wafer is adjusted by varying the angle of the break plane surface of the mandrel which supports the wafer relative to the break wheel.

Known breaking apparatus typically require close alignment between the scribe line along which the wafer is to be broken and the breaking mechanism of the apparatus. With the Turner apparatus of the '006 patent, this requires accurate alignment between the straight blade of the impulse bar and the scribe line, and with the Loomis apparatus, it requires close alignment of the scribe line relative to the break edge of the mandrel, and close alignment of the profile members of the break wheel to the scribe line. To accommodate a varying or different pitch between scribe lines, as, for example, for dies having a non-square profile or for wafers having different size dies, readjustment of the mechanism to accommodate the different pitches may require changing components of the breaking apparatus and involve substantial set-up time. Moreover, the contact force applied to the wafer by the breaking apparatus must be adjusted to avoid damage to sensitive components on the wafer as well as to avoid unwanted breaking of the wafer at places other than along the desired scribe line.

Another important factor that impacts breaking is that the size of parts to be broken has gotten smaller over the years. Due to the physics of breaking a part with a small ratio between die size and substrate material thickness, not only has the alignment become more critical, but also the force required to cause the break has grown. This imposes a greater requirement with known breaking apparatus for accurate alignment between the scribe lines to be broken and the breaking element, such as a breaker bar or edge, particularly the alignment with respect to the theta (rotary) axis. This contributes to an increase in the difficulty of breaking such parts.

It is desirable to provide breaking apparatus which avoids these and other problems of known devices by accommodating wafers with different die pitch, wafers of different materials and/or different thicknesses which may require different breaking forces, affords automated operation with quick and easy set-up, and is able to accommodate easily dies with different pitches. It is to these ends that the present invention is directed.

SUMMARY OF THE INVENTION

The invention avoids the foregoing and other problems of the prior art by providing methods and apparatus for breaking brittle substrates, such as wafers, that are simpler, more efficient, and are more tolerant of misalignment and breaking force values than are known methods and apparatus.

In one aspect, the invention affords a method of breaking a brittle substrate along a scribe line positioned relative to a pyramidal-shaped straight edge of an elongated bar, in which an elongated compressive member that covers and extends substantially the length of the scribe line is pressed onto the substrate with a sufficient force to bend the substrate over the edge and break the substrate along the scribe line.

In other more specific aspects, the compressive member may be a urethane member, and have a substantially uniform Shore A durometer in the range of about 70-100. The force applied to the substrate may be controlled by controlling the distance the compressive member moves relative to a reference position.

In another aspect, a compressive roller having a substantially uniform Shore A durometer in the range of 70-100 is used instead of an elongated compressive member, and the roller is caused to roll along the scribe line on the substrate while exerting sufficient force to bend the substrate over the edge of the bar to break it along the scribe line.

In yet another aspect, the invention affords an apparatus for breaking a brittle substrate along a scribe line that comprises a bending bar having a pyramidal-shaped edge, a positioner for aligning the scribe line with the edge, an elongated compressive member that extends substantially the length of the scribe line, and a breaking mechanism that presses the compressive member against the substrate with sufficient force to bend it over the edge and break it along the scribe line.

DESCRIPTION OF PREFERRED EMBODIMENTS

The present invention is particularly well adapted to breaking brittle semiconductor wafers along preformed scribe lines to separate microelectronic devices formed as individual dies on the wafer, and will be described in that context. However, as will become apparent from the description that follows the invention has greater utility and is applicable more generally to breaking of frangible substrates.

Figure 1:
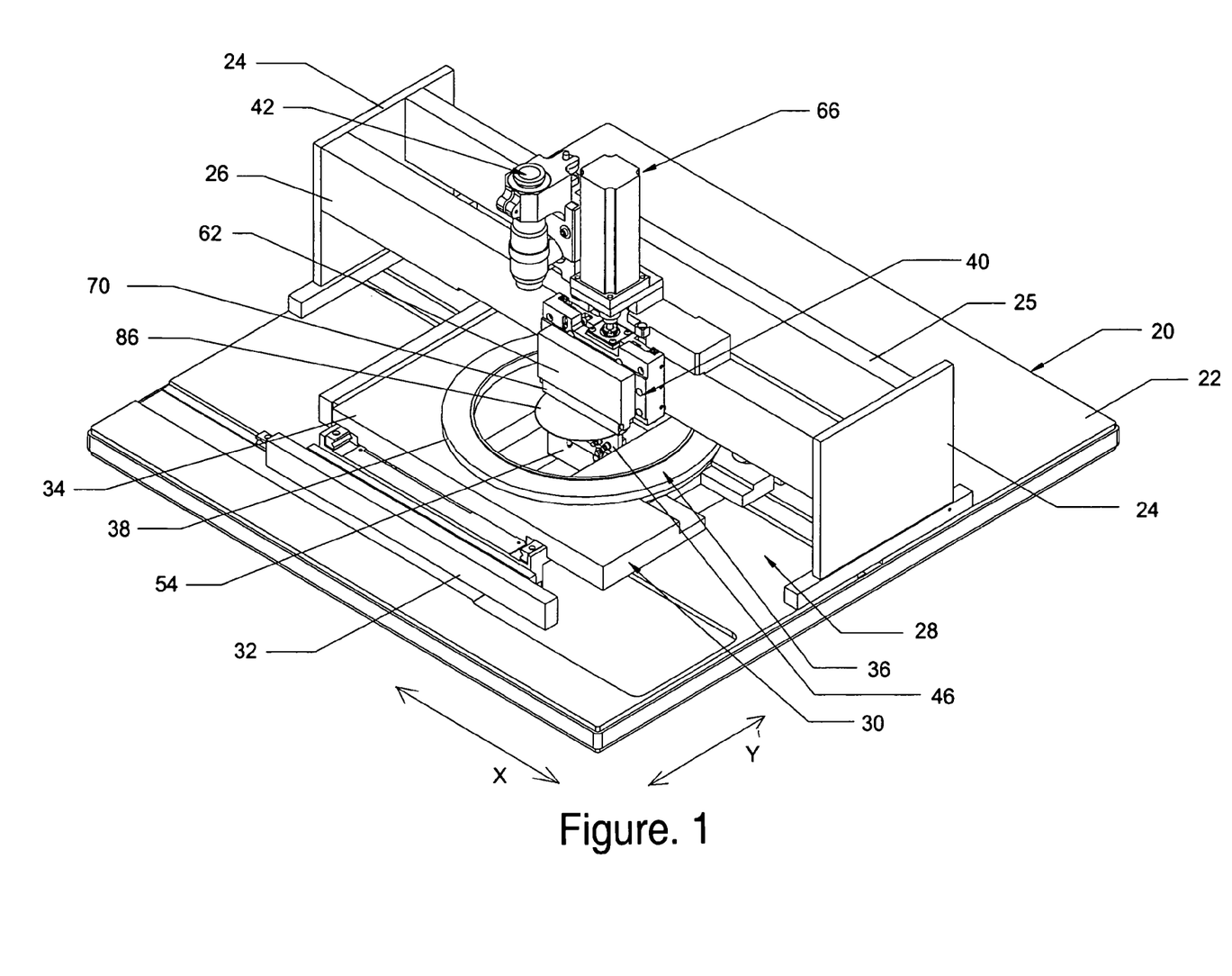
FIG. 1 is a perspective view of positioning and breaking apparatus embodying the invention.

FIG. 1 illustrates a positioning and breaking apparatus embodying the invention. As shown, the apparatus may comprise a base assembly 20 having a substantially planar base plate 22 upon which is mounted a pair of spaced vertical supports 24. A pair of horizontal support members 25, 26 may extend between the vertical supports a predetermined distance above the surface of the base plate. Base plate 22 may support a positioning system 28, comprising an X-Y positioning table 30 including an X-plate 32 movable relative to the base plate in a first "X" axis direction, and a Y-plate 34 movably supported on the X-plate for movement in an orthogonal "Y" axis direction. A theta table 36 may be supported on the Y plate for rotation about a vertical axis that is orthogonal to the plane of the Y plate. The theta table comprises a wafer-holding chuck 38, which may include magnetic elements and a vacuum ring, to hold a "hoop" or film frame carrier for a wafer, as will be described.

The positioning system 28 is preferably a precision mechanism that affords precisely controlled movement of the X and Y plates of the positioning table 30 in parallel planes along their respective axes, as by motors driving lead screws (not shown), and precisely controlled rotation the theta table 36 relative to the Y-plate 34 by another motor drive mechanism (not shown). The positioning system permits a wafer supported on the wafer chuck 38 to be positioned and aligned precisely relative to breaking apparatus 40 in accordance with the invention (to be described) which is mounted to support member 26. The wafer support and positioning system portion of the positioning and breaking apparatus shown in FIG. 1 comprising the base assembly 20, the X-Y positioning table 30 and the theta table and wafer chuck 36, 38 may have substantially the same construction and operation as in the wafer support and positioning system disclosed in the afore-referenced U.S. Pat. No. 5,820,006 to Turner, the disclosure of which is incorporated by reference herein. As disclosed in the Turner patent, the apparatus of FIG. 1 may also incorporate a scribing mechanism for scribing lines on a wafer supported on the wafer chuck 38. However, a scribing apparatus comprises no part of the present invention. Rather the invention addresses the breaking of pre-scribed wafers. If a scribing mechanism is employed with the positioning and breaking apparatus shown in FIG. 1, any suitable scribing apparatus or method may be employed for scribing wafers that are to be broken using the invention.

Figure 2:
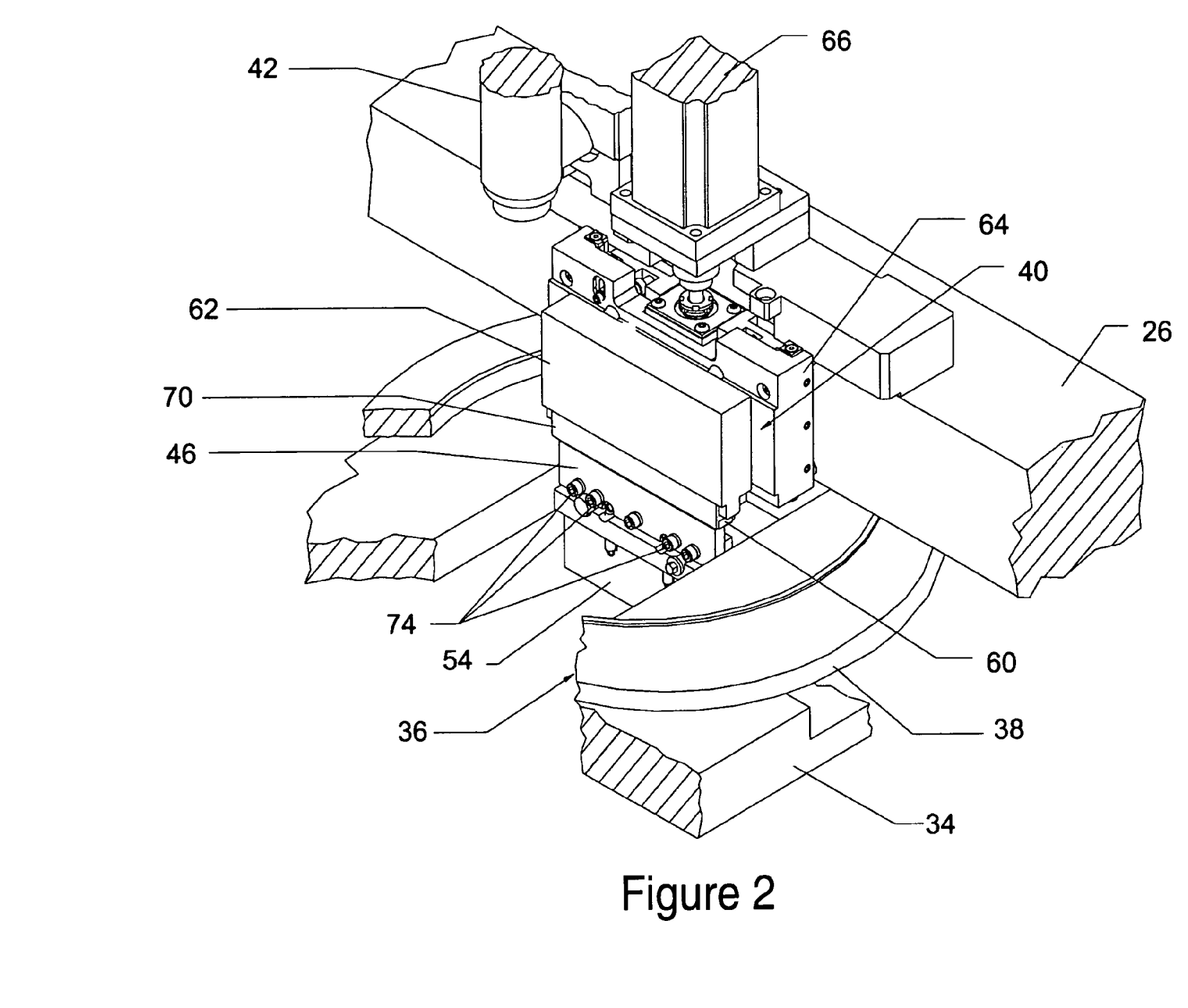
FIG. 2 is an enlarged perspective view of a portion of the positioning and breaking apparatus of FIG. 1.

As shown in FIGS. 1 and 2, horizontal support member 26 of the base assembly 20 may support a vertically (in the figures) movable breaking mechanism 40 of the breaking apparatus of the invention at a central location along the support member relative to the positioning system 28. As will be described in more detail shortly, the breaking mechanism 40 cooperates with a precision bending bar 46 to afford a highly advantageous and efficient breaking apparatus for breaking wafers supported on the wafer chuck 38. As is well known, semiconductor wafers typically have formed thereon a plurality of microelectronic devices or dies arranged in a matrix of rows and columns and separated by narrow pathways referred to as "streets". The wafers are broken along a plurality of orthogonal scribe lines arrayed in a grid on the wafer to extend along the streets between the dies to separate the wafer into individual dies. To facilitate alignment and positioning of the wafers relative to the breaking apparatus, a microscope camera 42 may also be supported on the support member 26 adjacent to the breaking mechanism 40. The microscope camera, which also may be substantially similar in structure and operation to that disclosed in the Turner patent, affords a magnified image of the wafer on the wafer chuck. The microscope camera permits images of the dies on the wafer surface to be displayed, for example, as on a video monitor or a display device of the computer system (shown in FIG. 6 and to be described later) which controls the apparatus. As will also be described shortly, the microscope camera enables scribe lines on the wafer to be aligned using the positioning system 28 relative to the precision bending bar 46 of the breaking apparatus of the invention.

As shown in the figures, the precision bending bar 46 of the invention may comprise an elongated rectangular plate, as of steel, for example, having a elongated straight pyramidal-shaped (in the transverse direction) edge 48 formed along the length of one side edge of the plate. The pyramidal-shaped edge may be precision ground along the side edge, for example. The bending bar may be mounted on the base plate 22 so that its smaller dimension (width) is oriented in a generally vertical position with the elongated straight pyramidal edge 48 of the bar extending horizontally in the X-direction parallel to the X-axis of the positioning system and aligned with the breaking mechanism 40. Preferably, the bending bar is mounted such that the wafer chuck may be positioned to centrally locate the bending bar within the annular opening of the wafer chuck, as shown in FIGS. 1 and 2, and such that the edge lies in a plane that corresponds to the plane of the bottom of a wafer (or film frame, as will be described) supported on the wafer chuck.

Figure 3:
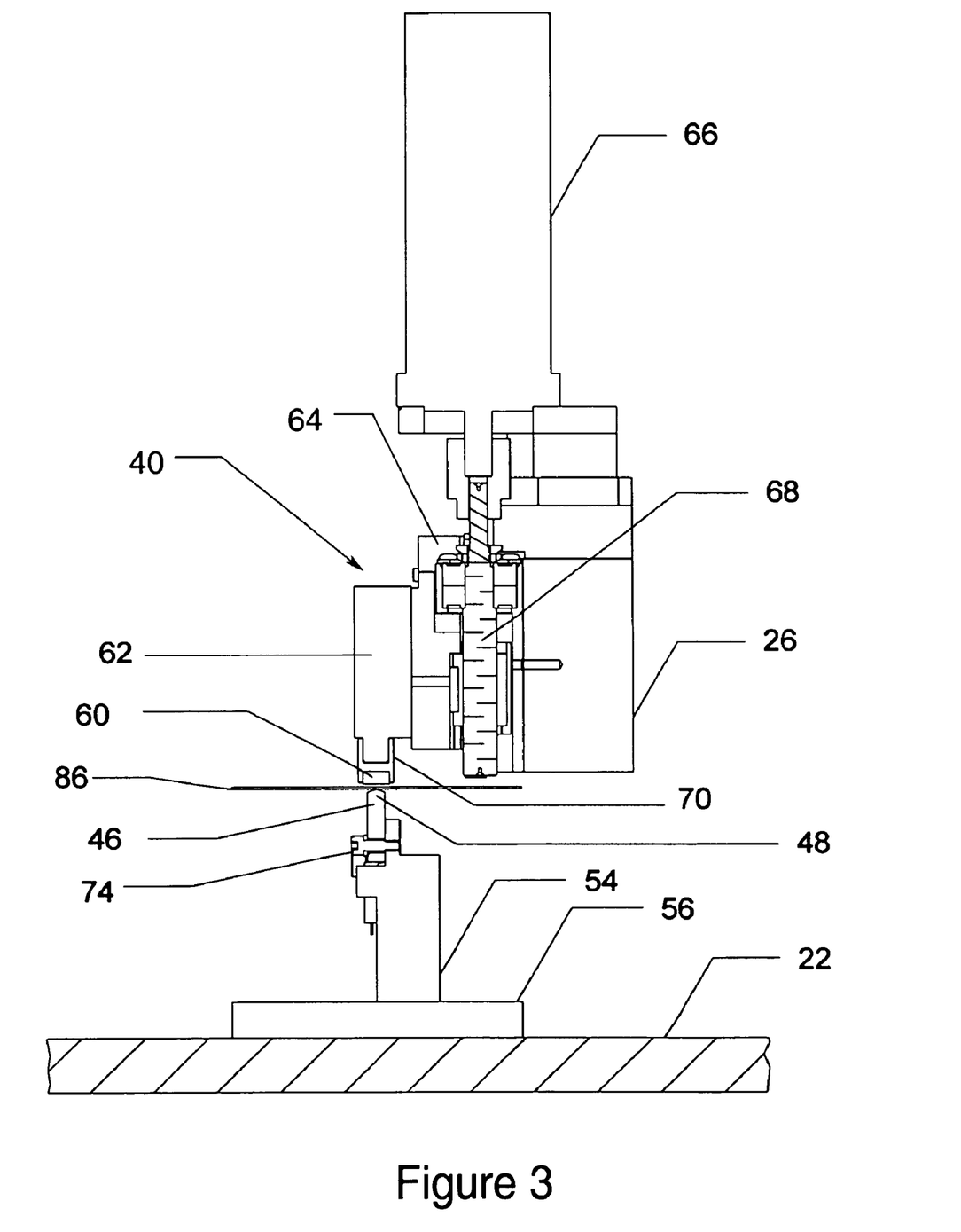
FIG. 3 is a side elevational view, partially in section, of the breaking mechanism of the apparatus of FIGS. 1 and 2.

The bending bar 46 may be attached to a support comprising a vertically oriented support member 54 having a horizontal flange 56 formed for mounting on the base plate 22, as best illustrated in FIG. 3. As shown in FIGS. 1-3, the support member 54 is preferably formed to enable the position of the bending bar to be adjusted vertically relative to the wafer chuck so that the pyramidal-shaped straight edge of the bending bar lies in a horizontal plane of the wafer chuck and corresponding to the lower planar surface of a film frame carrying a wafer supported on the wafer chuck. The precision bending bar should be mounted so that the elongated straight pyramidal edge contacts, preferably uniformly, and supports the lower surface of the film frame carrying the wafer, as best illustrated in FIGS. 3-5.

As shown in the figures, the precision bending bar 46 may be connected to the bending bar support 54 by a fastening mechanism comprising, for example, a plurality of bolts 74. The structure of the bending bar support, its connection to the base plate 22, and the construction of the fastening mechanism are preferably such that the precision bending bar may be adjusted to position the straight edge of the bending bar precisely aligned parallel to the X-axis and to lie in a horizontal plane at a vertical position corresponding to the bottom surface of a wafer supported on the wafer chuck. For this purpose, the support members 54, 56 may have elongated bolt slots, for example, that permit movement and adjustment of the bending bar relative to the support member 54 and the base plate 22. The elongated straight edge 48 of the bending bar need not be a sharp knife edge, as the impulse bar of the Turner patent, and the bending bar does not move to strike the wafer during operation. Rather, the bending bar is stationary and an edge supports the wafer aligned along a scribe line. The wafer is bent over the edge during the breaking process to break the wafer, as will be described in more detail below.

The length of the straight edge 48 of the precision breaking bar 46 is preferably greater than the diameter of a wafer which is to be broken, of the order of 4 to 6 inches, for example, depending on wafer size. It is desirable for the straight edge to contact uniformly the bottom of the wafer (or film frame) and to be aligned with and along the entire length of a scribe line. During setup of the apparatus, the microscope camera 42 may be employed to align a scribe line with the straight edge 48 of the bending bar. After alignment, using the X-Y positioning table 30, the wafer may be stepped or indexed in an orthogonal Y-direction to the edge, by a predetermined distance corresponding to the spacing ("pitch") between adjacent parallel scribe lines. This aligns successive scribe lines with the edge of the bending bar so that the wafer may be broken along each line. Then, the wafer may be rotated 90 degrees by the theta table 36 and the scribe lines extending orthogonally to the first set of lines successively aligned with the edge of the bending bar for breaking. The breaking process will be described below.

The breaking mechanism 40 of the invention comprises a vertically moveable compressive member 60 that cooperates with the precision bending bar edge 48 to bend a wafer over the edge to break the wafer along a scribe line. As best shown in FIGS. 1-5 the compressive member 60 may comprise an elongated bar-shaped member mounted on a support block 62 which, in turn, is connected to a slide assembly 64 that is slideably supported for vertical movement on horizontal support 26. The compressive member is supported so that it lies in a horizontal plane and extends in the X-direction parallel to the X-axis of the positioning apparatus, as shown. The compressive member is positioned to be aligned with and generally centered over the horizontally extending straight edge 48 of the precision bending bar, as best illustrated in FIGS. 4-5. Movement of the slide assembly 64 may be controlled by a drive mechanism comprising a motor 66 which drives a lead screw mechanism 68, for example, that enables the slide assembly to be moved vertically relative to the horizontal support, as shown in FIGS. 2 and 3. The lead screw mechanism 68 and drive motor 66 are preferably formed to afford fine, precisely controlled vertical movement of the slide assembly relative to the horizontal support 26. This, in turn, allows the vertical position of the compressive member 60 carried by the support 62 to be precisely controlled relative to a wafer supported on the wafer chuck. As shown in the figures, the compressive member 60 may be disposed within an elongated channel-shaped mounting bracket 70 that is carried on a lower horizontal edge of the support block 62. This advantageously permits the compressive member to be easily replaced or a compressive member with different characteristics substituted.

The compressive member may have a length that extends the length of the pyramidal-shaped edge 48 of the precision bending bar. Moreover, the compressive member support block 62 and mounting bracket 70 are preferably constructed and connected to the slide assembly 64 such that the compressive member extends parallel to the straight edge 48 of the precision bending bar with the plane of the compressive member being in a horizontal plane and parallel to the edge. The slide assembly 64 is constructed and connected to support 26 such that upon the slide assembly 64 being moved vertically by the drive motor 66, the compressive member similarly moves vertically relative to the precision bending bar while remaining horizontal and parallel with the straight edge 48. This enables the compressive member to be lowered into uniform contact with the upper surface of a wafer supported on the wafer chuck over the length of the member, and, therefore, to exert a uniform force on the wafer.

Figure 4A:
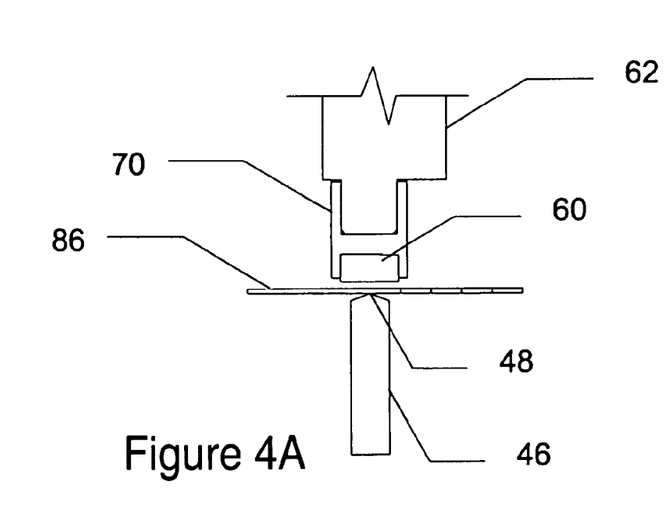
FIG. 4 comprising FIGS. 4 A-C is a series of diagrammatic views that illustrate the breaking and the indexing operation of breaking apparatus in accordance with the invention.
Figure 4B:
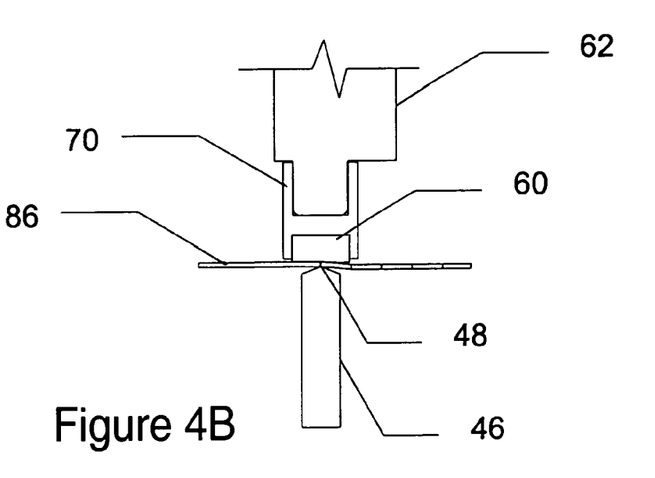
Figure 4C:
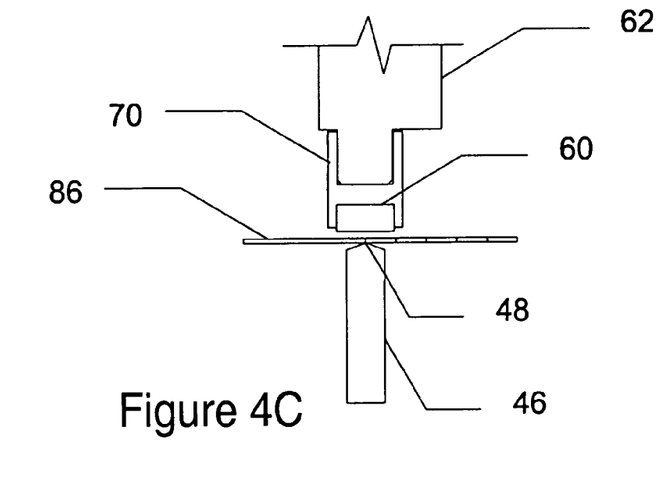
Figure 5:
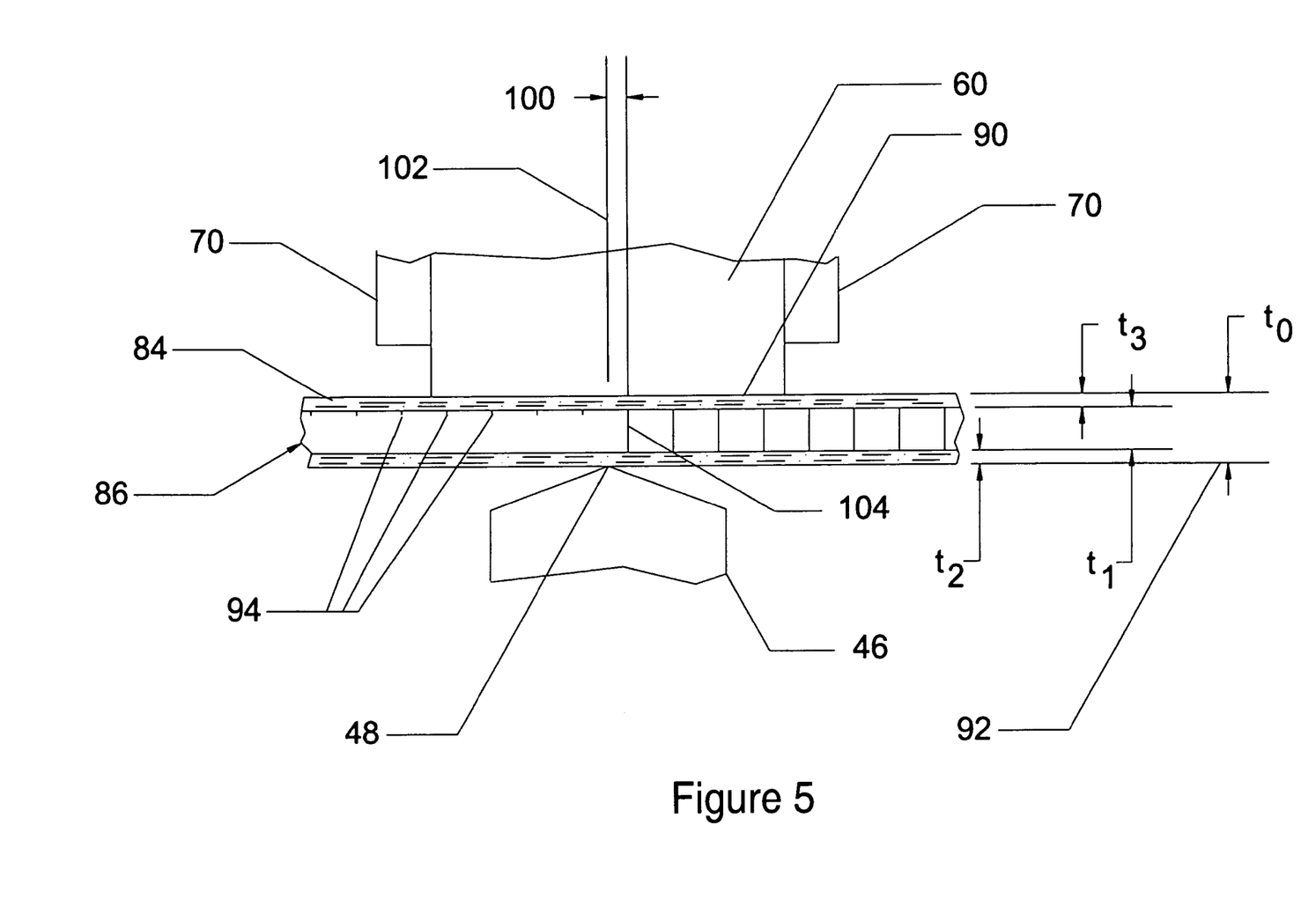
FIG. 5 is an enlarged diagrammatic view illustrating in more detail the structure of a film frame wafer carrier and the positioning of a wafer in relation to a precision bending bar and a compressive member of the breaking apparatus of the invention.

FIGS. 4A-C illustrate successive steps of a breaking process in accordance with the invention. Referring first to FIG. 5, a wafer 80 to be broken may be supported on a film frame comprising an adhesive film membrane 82, as of polyethylene, connected to a steel frame or "hoop" (not shown) sized to be supported on the wafer chuck 38. The wafer chuck may have a vacuum arrangement and may further comprise magnets in the chuck for holding the frame in position on the chuck, as indicated previously and as described in the previously referenced U.S. Pat. No. 5,820,006 to Turner. As shown in FIG. 5, the upper surface of the wafer may have a covering membrane 84, as of Mylar, to protect the dies formed on the wafer. The cover membrane 84 is optional and may be omitted, but is advantageous in providing protection for devices formed on the wafer. As shown, the wafer 80 and membranes 82 and 84 together comprise a film frame assembly 86 having a total thickness of $t_0$, comprising the sum of the wafer thickness, $t_1$, the thickness, $t_2$, of the adhesive membrane 82, and the thickness, $t_3$, of the Mylar cover membrane 84.

During set-up of the breaking apparatus, a zero reference position relative to the film frame 86 may be established for the compressive member, and its vertical movement may be controlled during the breaking process relative to the zero reference position. An initial zero reference may be established for the compressive member 60 by lowering the compressive member 60 with the slide assembly 64, without a film frame and wafer in place on the wafer chuck, until the lower surface 90 of the compressive member just makes contact with the pyramidal-shaped edge 48 of the precision bending bar. This position corresponds to the location of a horizontal line 92 in FIG. 5 corresponding to the bottom surface of the adhesive membrane 82 that will be supported on the wafer chuck, and is taken as the initial "zero" reference position of the compressive membrane. This position may be automatically determined by setting the motor to very low power, pressing the compressive member against the breaker bar, and reading a position encoder. The known compression value of the compressive member may be used as a compressive offset to establish the reference position.

Next, a wafer that has been scribed to induce lines 94 of higher stress concentration may be placed on the adhesive membrane 82 and, if desired, covered with the cover membrane 84 to form film frame 86. Adhesive membrane 82 serves as a flexible carrier for the wafer that allows the wafer to be bent over the edge 48. The film frame carrying the wafer 80 is then placed on the wafer chuck and held by either vacuum or magnets or a combination of both, as previously described. Using the microscope camera 42 and the X-Y and theta positioning tables 30, 36, a scribe line of the wafer then may be aligned with the straight edge 48 of the precision bending bar. This may be done manually using the control system illustrated in FIG. 6 to control the positioning tables to align the scribe line with the straight edge, or it may be done automatically, as by using pattern recognition software which identifies the scribe line and controls the positioning tables to align automatically the scribe lines with the straight edge of the precision bending bar. During this alignment process, the compressive member 60 is raised out of contact with the wafer, to the position illustrated in FIG. 4A.

Next, the slide assembly is lowered to bring the lower "planar" surface 90 of the compressive member just into contact with the upper surface of cover membrane 84. This is the position illustrated in FIG. 5 where the lower surface 90 is shown at the location of the horizontal line 98 corresponding to the upper surface of the membrane. Line 98 corresponds to a new "zero" reference position. It may be determined by adding a distance to, corresponding to the thickness of the adhesive membrane film, wafer and upper membrane assembly 86, to the previously determined initial "zero" reference position corresponding to line 92. This may be done with the CPU 110 of the computer control system of FIG. 6, to be described. The new "zero" reference may be stored in a memory 112 as a reference for the vertical position of the compressive member.

For breaking of the wafer, the control system controls the slide assembly 64 and the movement of the compressive member relative to the new "zero" reference position to move the compressive member a predetermined distance downwardly from the "zero" reference position to bend the wafer over the straight edge 48 of the precision bending bar and fracture the wafer along a scribe line 104 aligned with the straight edge 48. This is a position illustrated in FIGS. 4B and 5. The control system then raises the compressive member to the position illustrated in FIG. 4C and controls the positioning system to index or step the wafer in the Y-direction by an amount corresponding to the pitch between scribe lines. This aligns a next scribe line 94 with the straight edge 48. The compressive member is then lowered again, as just described above, to break the wafer at this scribe line. The compressive member then may be raised, the wafer stepped into the next position and the process repeated to successively break the wafer along each scribe line 94.

This breaking process may be performed either manually or automatically by the control system. The pitch between scribe lines is related to the die pitch on the wafer, and the pitch may be different in orthogonal directions. For automatic operation, the system may align the first scribe line at the edge of the wafer with the straight edge 48, break the wafer along that scribe line, and then index the wafer in the Y-direction by a preset distance corresponding to the pitch to align and break the wafer along the next scribe line. After traversing completely across the wafer in one direction, the wafer may be rotated 90° by the theta table. A scribe line at one edge of the wafer which extends orthogonally to the previously broken scribe lines may be aligned with the straight edge, and the breaking process repeated as described above to break the wafer along the orthogonal scribe lines. If the pitch between this set of orthogonal scribe lines is different from the first set, the indexing of the positioning table may be adjusted appropriately by the control system for the new pitch.

At the conclusion of the breaking process, the wafer will have been separated into individual square or rectangular-shaped dies. The adhesive membrane 82 of the film frame holds the individual separated dies in place on the membrane until they are subsequently removed. The upper membrane 84 is optional, as noted, but its use is advantageous for also helping to maintain the separated dies attached to the adhesive membrane 82 after breaking.

The compressive member 60 may comprise a strip or bar of compliant, resilient material, such as urethane. Preferably, it has a relatively high Shore A durometer in a range of the order of 70-100, and most preferably a durometer of approximately 95. The durometer and resiliency of the compressive member should be uniform and so that the compressive member is free of voids or uneven areas so that the compressive member returns to its original shape when force is removed. This enables a uniform compressive force to be applied to the wafer. Different compliant materials may be used for the compressive member so long as they have uniform durometer and resiliency characteristics, and have the appropriate durometer. The compressive member should have a length that is approximately equal to the length of straight edge 48 of the bending bar as noted, and that is greater than the diameter of the wafer to be broken so that the compressive member spans and completely covers the longest scribe line on the wafer. This desirably allows the compressive member to apply a uniform controlled force along a scribe line over the length and width of the compressive member. The width of the compressive member should be large enough to provide a reasonable force over a region of the wafer sufficiently large to enable the wafer to be easily bent over the straight edge of the bending bar. The width of the compressive member (in the Y-direction) may span multiple parallel scribe lines. In one embodiment of the invention, a compressive member having a length of the order of 4 to 6 inches, a width in the order of 8 mm, and a durometer of 95 was employed to break a silicon carbide wafer having microelectronic devices with a 300 micron pitch.

The vertical distance below the zero reference level that the compressive member travels after contacting the upper surface of the wafer or covering membrane determines the force applied to the wafer, and may be preset and stored in memory 112 of the control system for the particular wafer to be broken. The force required for breaking a wafer is a function of the wafer material, its thickness, and the pitch of the die. For contact breaking, the pitch-to-thickness ratio is typically of the order of 5 or 6 to 1. With a smaller pitch, it is more difficult to break the wafer and more force is needed. The invention advantageously allows contact breaking of small pitch wafers without the danger of damaging die components due to the crushing of the die, as would be the case with a rigid non-compliant contact member. Also, wafers of "softer" materials are more easily broken, and require less force.

For breaking the silicon carbide wafer described above with a 300 micron die pitch and using a compressive member having a 95 durometer, the predetermined distance below the "zero" reference level at which the compressive member contacts the upper surface of the wafer or the covering membrane required for reliable breaking of the wafer was established by determining a range between a minimum distance at which marginal breaking occurred and a maximum distance at which the wafer was susceptible to breaking at other than the desired scribe line. For this particular wafer, the distance range of movement below the zero reference was found to be between about 0.08 inches for marginal breaking and about 0.015 inches for the upper limit at which uncontrolled breaking occurred, i.e., a range of 8-15 mils. This is referred to as the process window. Accordingly, for this example, it was found that setting the movement of the compressive member from the zero reference position to be in about the center of this range, i.e., a distance of the order of 11 mils, afforded reliable breaking of the wafer. For other wafer materials, thicknesses, and die pitches, the distance range and optimum distance may be different, and may be determined in a similar manner.

As noted, accurate alignment of scribe lines with the straight edge of the bending bar and with the center of the compressive member is not necessary with the invention. This is indicated in FIG. 5 which shows an off-set 100 between a center line 102 of the compressive member and the edge 48, and a break 104 along a scribe line of the wafer. The invention has been found to afford reliable breaking along the scribe lines with an off-set distance 100 of the order of 1-2 mils (0.001-0.002 inch) or about 5-7% of die size, and an angular offset of the order of 0.01 degrees. This is advantageous in facilitating automated operation of the breaking process without the need for precise alignment of scribe lines with the breaking apparatus, and permits the invention to handle readily wafers with different die pitch without the necessity with a time-consuming set-up and realignment when the die pitch changes.

The use of a compressive member rather than a hard or rigid member is advantageous in that it allows a compressive force to be applied by contacting the wafer directly over the length and width of the compressive member that is sufficient to break the wafer without crushing or otherwise causing damage to the die and the wafer as could be the case with a rigid member.

Another advantage of the invention is that accurate alignment of scribe lines with the straight edge of the bending bar and compressive member is not required, and there is no need to change or readjust the breaking element to accommodate dies with a different pitch as, for example, rectangular-shaped dies, as can be necessary for conventional breaking elements, such as break rollers. Thus, the invention can readily accommodate dies with different pitches. Conventional breaking approaches typically require a difficult and time-consuming setup. In such cases, there is frequently a need to change a breaking element, such as a roller, when the wafer is rotated 90° to break it along orthogonal scribe lines.

Figure 6:
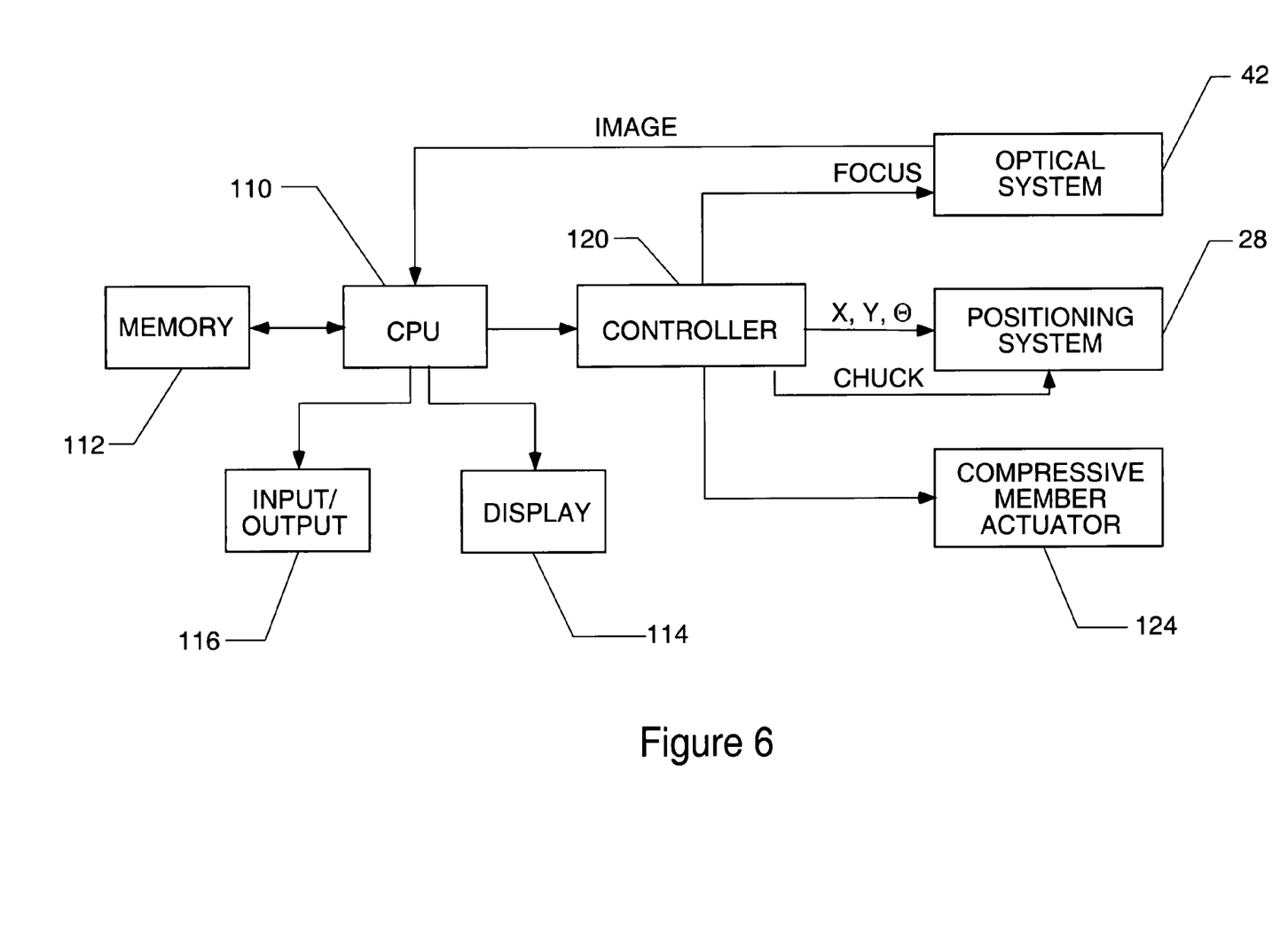
FIG. 6 is a block diagram of a computer control system for the positioning and breaking apparatus of the invention.

FIG. 6 illustrates an embodiment of a control system that may be used for controlling the positioning and breaking apparatus of the invention. As shown, a central component of the system is CPU 110, which may comprise a microcontroller or microprocessor having an associated memory 112, display device 114, and I/O devices 116. The I/O devices may comprise a keyboard, a mouse, and/or a joystick, for example. The CPU 110 may drive a controller 120 which interfaces with the positioning system 28 comprising the X-Y and theta positioning tables, 30, 36, a compressive member actuator 124, which may comprise drive motor 66, and an optical system 126, which comprises the microscope camera 42 and an associated focusing mechanism.

The microscope camera may be focused and controlled by the CPU 110 via the controller 120 to provide an image of a wafer located on the wafer chuck of the positioning system 28. The image may be provided to a display device 114, such as a video or computer monitor, to permit an operator to manually align a scribe line with the precision bending bar during a set up operation, as well as to manually control the positioning and breaking apparatus as desired using, for example, a joystick. As also indicated in FIG. 6, the controller 120 provides control signals to positioning system 28 to align the wafer relative to the breaking apparatus, and, it may provide a control signal for controlling the vacuum of the wafer chuck to hold a film frame and wafer in a predetermined position on the chuck. Controller 120 further provides control signals to the compressive member actuator 124 to control the vertical movement of the slide assembly 64 and to cause the compressive member to apply the desired compressive force to a wafer for breaking.

Memory 112 may store appropriate CPU control programs for controlling the positioning and breaking apparatus, and may store system operating parameters, for example, for different wafers and die pitches. The memory may store software for automatically controlling the operation of the apparatus to position and break the wafer along successive scribe lines, including automatically indexing the wafer by a predetermined die pitch to an adjacent scribe line. Software may include appropriate pattern recognition software that analyzes the images provided by the microscope camera optical system to identify and automatically align scribe lines relative to the bending bar edge. Pattern recognition software may be used during set up of the apparatus and for fine control to align scribe lines with the bending bar edge after the apparatus indexes the wafer by a preset die pitch. For wafers with different die pitch in orthogonal directions, the software may detect the last scribe line along a first direction, and then control the apparatus to automatically rotate the wafer 90° for breaking it along scribe lines running in an orthogonal direction. The software may then automatically align the first scribe line for breaking, and index the wafer by the appropriate die pitch for breaking along successive lines in the orthogonal direction.

Figure 7:
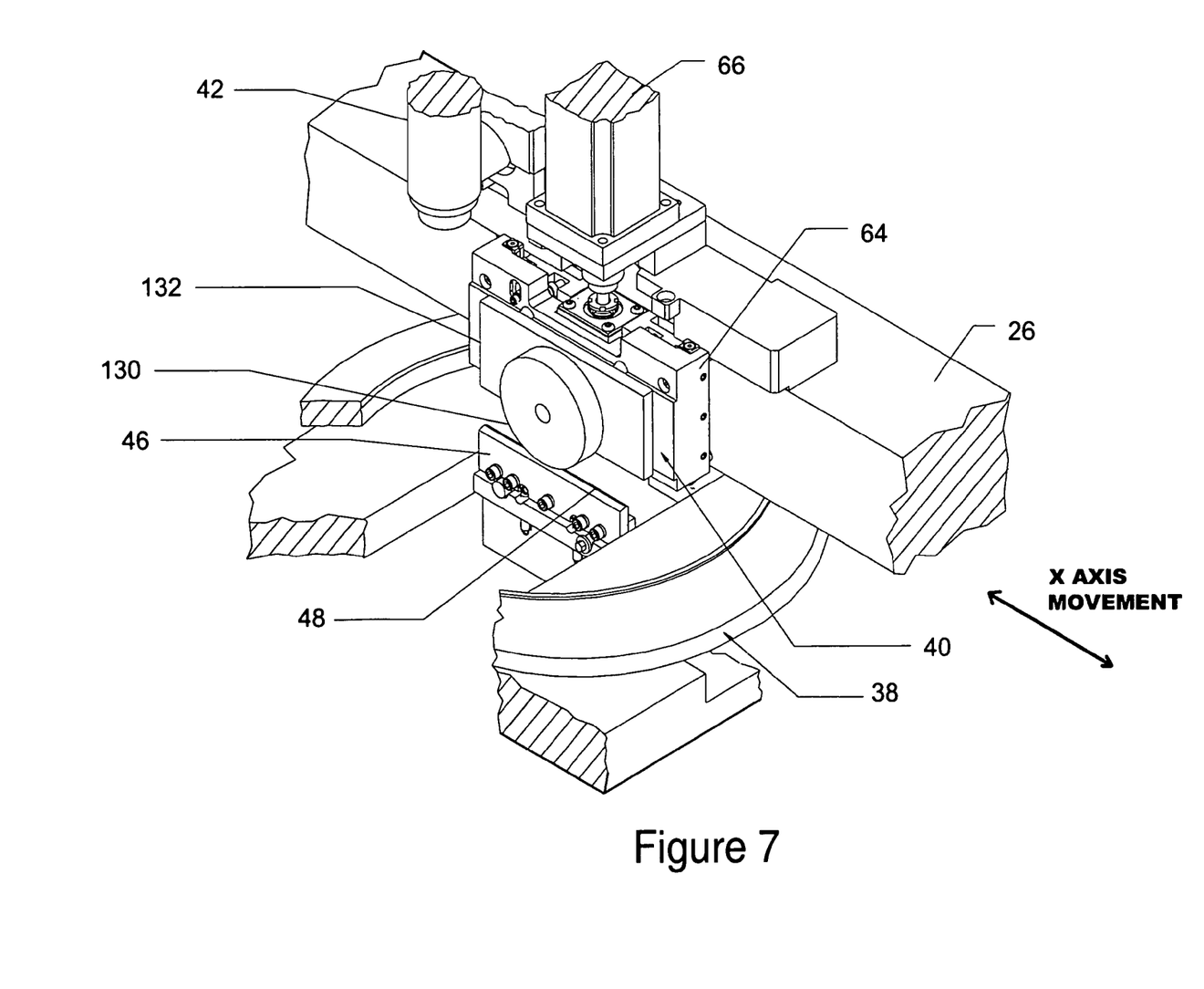
FIG. 7 is a perspective view similar to FIG. 2 of a second embodiment of breaking apparatus in accordance with the invention.
Figure 8:
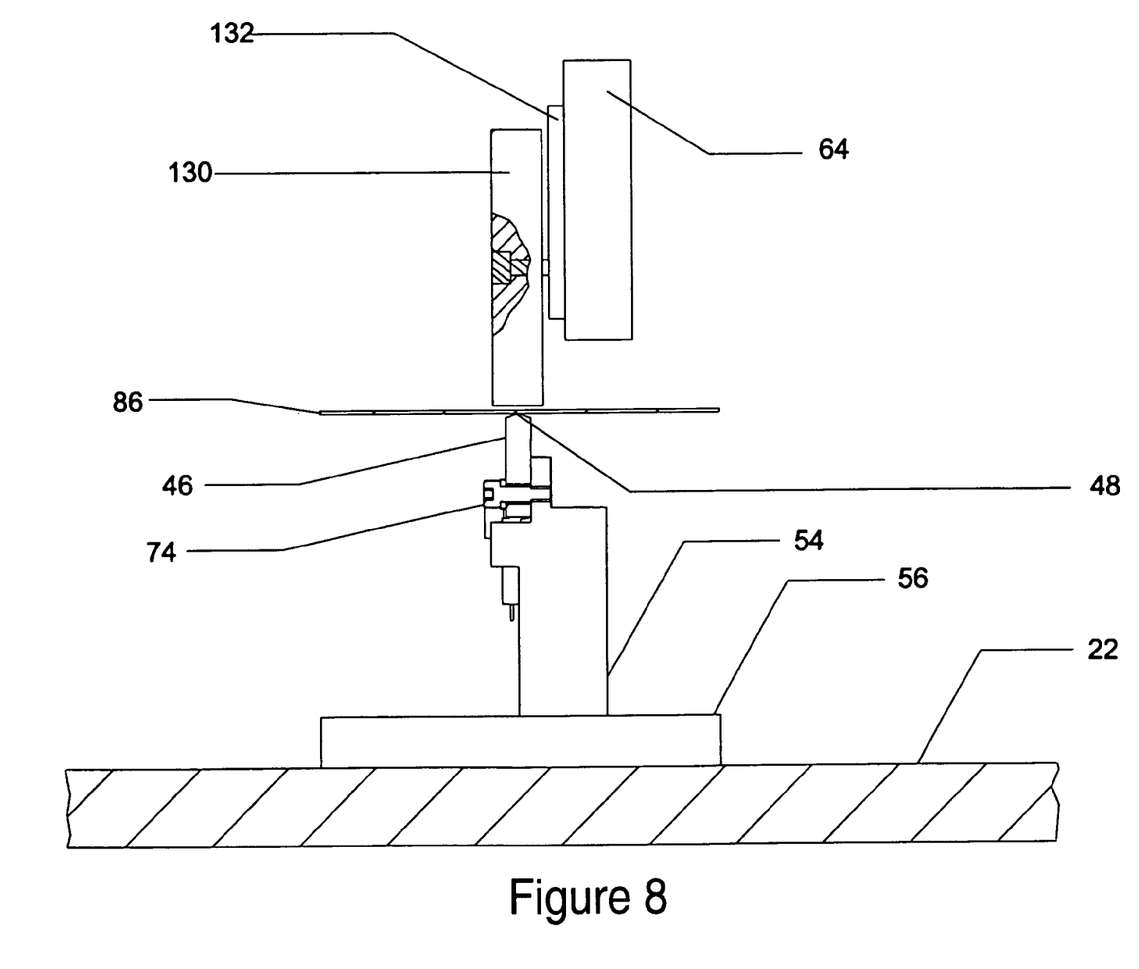
FIG. 8 is a side elevational view of a portion of the breaking apparatus of the second embodiment of the invention.

FIGS. 7 and 8 illustrate an alternative embodiment of the invention. In the alternative embodiment, the compressive member may be a compressive roller 130, rather than an elongated compressive bar as in the first embodiment. As shown, the compressive roller may be rotatably mounted on a mounting bracket 132 connected to the slide assembly 64. The compressive roller may be positioned relative to the position bending bar 46, as best illustrated in FIG. 8, to engage and bend a wafer 134 over the straight edge 48 of the bending bar to break the wafer along scribe lines. As with the first embodiment, after aligning a scribe line with the straight edge of the bending bar, the slide assembly 64 may be controlled to lower the compressive roller 130 into contact with the wafer (the zero reference position), and then move further downwardly to apply a predetermined compressive force to the wafer as described in connection with the first embodiment.

The breaking process may begin with the compressive roller contacting the wafer and the scribe line at one edge of the wafer. Next, the X-Y positioning table 30 may be controlled to move along the X-axis, as indicated in FIG. 7 to cause the wafer to move under the roller 130. As the wafer moves in the X direction, the compressive roller rolls over the surface of the wafer along the scribe line, causing the wafer to bend over the straight edge of the precision bending bar. After breaking the wafer along one scribe line, the compressive roller may be raised, the wafer indexed to the next scribe line, and the process repeated to break the wafer along that scribe line. Except for the use of a compressive roller as a breaking member and controlling the movement of the wafer relative to the roller to cause it to roll along a scribe line for breaking the wafer, the apparatus of the alternative embodiment and its operation may be substantially the same as the first embodiment.

As with the first embodiment, the compressive roller 130 may be formed of urethane having a relatively high durometer in the range of 70-100, and most preferably of the order of 95 durometer. Also, as with the first embodiment, it is desirable that the durometer and resiliency of the compressive roller be uniform so that the compressive roller applies a uniform force to a wafer as it rolls over the wafer surface. With the compressive roller, somewhat less breaking force is required than with the compressive bar, since the wafer breaks locally and the roller propagates the fracture along the scribe line. In other respects, using the roller is similar to using the bar.

While the foregoing has been with reference to particular embodiments of the invention, it will be appreciated the changes in these embodiments may be made without departing from the principles of the invention, the scope of which is defined by the appended claims.

The invention claimed is:

1. A method of breaking a brittle substrate along a scribe line, comprising:
   positioning the scribe line relative to a pyramidal-shaped straight edge of an elongated bar;
   contacting the substrate with an elongated compressive member that extends substantially the length of the scribe line and covers the scribe line; and
   pressing the compressive member onto the substrate to exert a force on the substrate sufficient to bend the substrate over the edge of the bar and to break the substrate along the scribe line.

2. The method of claim 1, wherein the compressive member comprises a strip of compliant material having a length greater than the substrate and a width that extends across the scribe line, and has a planar surface that contacts the surface of the substrate substantially uniformly.

3. The method of claim 2, wherein the compressive member has a substantially uniform Shore A durometer in the range about 70-100, and a substantially uniform resiliency.

4. The method of claim 3, wherein the durometer of the compressive member is of the order of 95.

5. The method of claim 2, wherein the compressive member comprises urethane.

6. The method of claim 1, wherein said positioning comprises aligning the scribe line and the straight edge of the bar with the substrate supported on the bar at the apex of the straight edge.

7. The method of claim 6, wherein said contacting comprises establishing a reference position at which the compressive member contacts the surface of the substrate, and said pressing comprises controlling the movement of the compressive member to move the member a predetermined distance beyond said reference position to exert a predetermined force on the substrate.

8. The method of claim 6, wherein said controlling comprises establishing a range of movement between two distance values, and selecting an intermediate distance between said values as said predetermined distance.

9. The method of claim 8, wherein said establishing comprises establishing as said two distance values a first distance value at which marginal breaking of the substrate occurs, and a second distance value at which breaking of the substrate occurs at other than along the scribe line.

10. The method of claim 6, wherein there are plurality of scribe lines on the substrate, and said positioning comprises positioning successive scribe lines relative to the straight edge, and breaking the substrate along said successive scribe lines.

11. The method of claim 10, wherein said scribe lines comprise parallel scribe lines having a predetermined pitch, and said positioning comprised indexing the substrate relative to said straight edge in a direction orthogonal to said parallel lines and by a distance corresponding to the pitch.

12. The method of claim 11, wherein said scribe lines comprise another plurality of parallel scribe lines with another predetermined pitch extending orthogonally with respect to the first-mentioned parallel lines, and said positioning further comprises positioning said other plurality of scribe lines relative to the straight edge, and breaking the substrate along said other plurality of scribe lines.

13. The method of claim 12, wherein said substrate comprises a semiconductor wafer having a plurality of dies separated by said parallel lines, and said method comprises automatically positioning successive scribe lines relative to the straight edge, and breaking the wafer along said successive scribe lines to separate the dies.

14. The method of claim 13, wherein said automatically positioning comprises detecting the positions of successive scribe lines using a pattern recognition process, and automatically positioning the scribe lines of the wafer relative to the straight edge using said pattern recognition.

15. A method of breaking a brittle substrate along a scribe line, comprising:
   positioning the scribe line relative to a pyramidal-shaped straight edge of an elongated bar;
   contacting the substrate with a compressive roller of substantially uniform Shore A durometer in the range about 70-100, such that the compressive roller spans the scribe line;
   pressing the compressive roller onto the substrate to exert a predetermined force on the substrate; and
   causing the compressive roller to roll over the substrate along the scribe line while exerting sufficient force to bend the substrate over the edge of the bar and to break the substrate along the scribe line.

16. The method of claim 15, wherein said compressive roller has a durometer of the order of 95.

17. The method of claim 15, wherein said pressing comprises establishing a reference position at which the roller contacts the substrate, and moving the roller a predetermined distance beyond the reference position to press the roller against the substrate and exert said predetermined force on the substrate.

18. The method of claim 17, wherein said contacting comprises contacting the substrate at an end of said scribe line, and said pressing comprises varying the pressing as the roller rolls over the substrate to vary said predetermined force.

19. Apparatus for breaking a brittle substrate along a scribe line thereof, comprising:
   a bending bar having a straight pyramidal-shaped edge;
   a positioner for aligning the scribe line with said edge;
   an elongated compressive member sized to extend substantially the length of the scribe line; and
   a breaking mechanism for pressing the compressive member against the substrate in the region of the scribe line with a sufficient force to bend the substrate over the edge and to break the substrate along the scribe line.

20. The apparatus of claim 19, wherein the compressive member comprises a strip of compliant material having a length greater than the substrate, a width that extends across the scribe line, and a planar surface that contacts the surface of the substrate and the scribe line substantially uniformly.

21. The apparatus of claim 20, wherein the compressive member has a substantially uniform Shore A durometer in the range about 70-100, and a substantially uniform resiliency.

22. The apparatus of claim 21, wherein the durometer of the compressive member is of the order of 95.

23. The apparatus of claim 19, wherein said breaking mechanism comprises a support formed to carry the compressive member, the support being supported for movement relative to the bending bar, a drive mechanism for moving the support and the compressive member to contact the substrate, and a control system for controlling the drive mechanism to move the compressive member a predetermined distance beyond a reference position in order to exert a predetermined force on the substrate.

24. The apparatus of claim 23, wherein the control system controls the positioner and comprises a pattern recognition system to align said scribe line on the substrate with the straight edge.

25. The apparatus of claim 24, wherein there is a plurality of scribe lines on the substrate, and the control system controls the positioner to automatically align successive scribe lines with the straight edge, and controls the breaking mechanism to break the substrate along said successive scribe lines.

26. The apparatus of claim 19, wherein said positioner comprises an X-Y-theta positioning system that supports the substrate at the apex of the straight edge with the scribe line aligned with the straight edge.

* * * * *